(12) United States Patent
Haji et al.

(10) Patent No.: US 8,192,578 B2
(45) Date of Patent: Jun. 5, 2012

(54) CHIP PICKUP APPARATUS, CHIP PICKUP METHOD, CHIP RELEASING DEVICE AND CHIP RELEASING METHOD

(75) Inventors: Hiroshi Haji, Fukuoka (JP); Mitsuru Ozono, Fukuoka (JP); Teruaki Kasai, Fukuoka (JP); Kazuhiro Noda, Fukuoka (JP)

(73) Assignee: Panasonic Corporation, Osaka (JP)

( * ) Notice: Subject to any disclaimer, the term of this patent is extended or adjusted under 35 U.S.C. 154(b) by 566 days.

(21) Appl. No.: 12/089,865

(22) PCT Filed: Oct. 13, 2006

(86) PCT No.: PCT/JP2006/320471
§ 371 (c)(1),
(2), (4) Date: Apr. 10, 2008

(87) PCT Pub. No.: WO2007/043654
PCT Pub. Date: Apr. 19, 2007

(65) Prior Publication Data
US 2009/0279995 A1 Nov. 12, 2009

(30) Foreign Application Priority Data
Oct. 14, 2005 (JP) .................. 2005-300044

(51) Int. Cl.
*B32B 38/10* (2006.01)
(52) U.S. Cl. ........ 156/707; 156/716; 156/719; 156/758; 156/765; 156/767; 156/932; 156/943; 438/464; 438/976

(58) Field of Classification Search .................. 156/344, 156/584, 707, 716, 719, 758, 765, 767, 930, 156/932, 941, 943; 438/464, 976
See application file for complete search history.

(56) References Cited

U.S. PATENT DOCUMENTS
2009/0242124 A1* 10/2009 Konno et al. .................. 156/344

FOREIGN PATENT DOCUMENTS
| JP | 02-186657 | | 7/1990 |
| JP | 06085060 A | * | 3/1994 |
| JP | 06-097212 | | 4/1994 |
| JP | 2679266 | | 1/1997 |

OTHER PUBLICATIONS
International Search Report for PCT/JP2006/320471; Dec. 12, 2006.

* cited by examiner

*Primary Examiner* — Mark A Osele
(74) *Attorney, Agent, or Firm* — Pearne & Gordon LLP

(57) ABSTRACT

In the pickup apparatus wherein a chip adhered on a sheet is sucked and held by a picking nozzle and then picked up by the nozzle, a sheet push-up member configured by forming flexible elastic material such as rubber in a spherical shape is attached on the abutment supporting surface of the upper surface of a tool, then the push-up surface of the sheet push-up member is followed in a flat surface state along the lower surface of the sheet and abutted thereto in the moving down state of the picking nozzle, and then the push-up surface pushes up the lower surface of the sheet while being deformed in a upwardly protruded curved surface shape in the moving up operation where the picking nozzle moves up together with the chip. Thus, the chip can be released from the sheet from the outer peripheral side of the chip.

16 Claims, 11 Drawing Sheets

FIG. 8
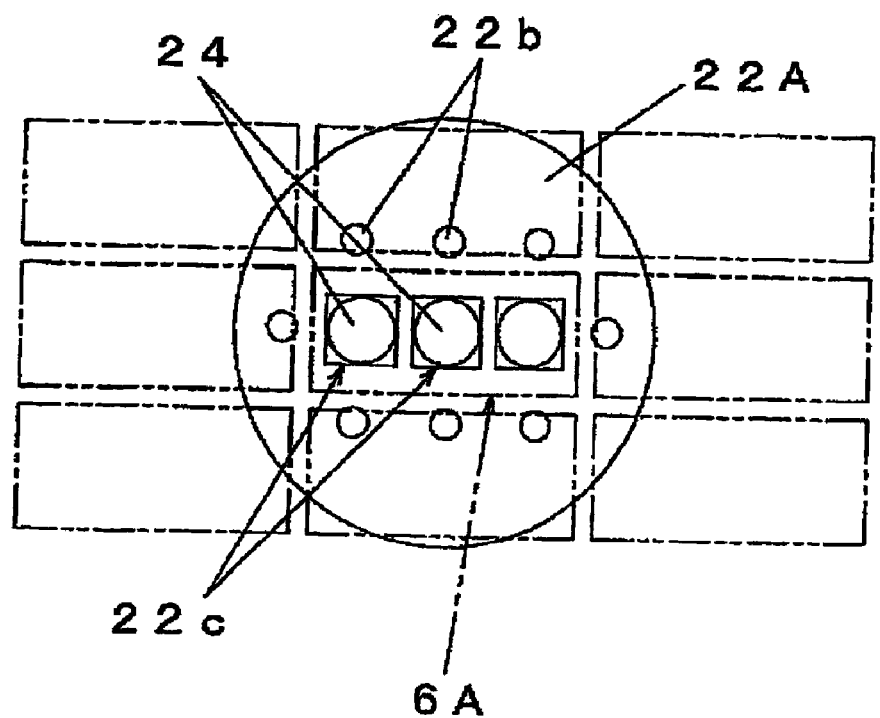
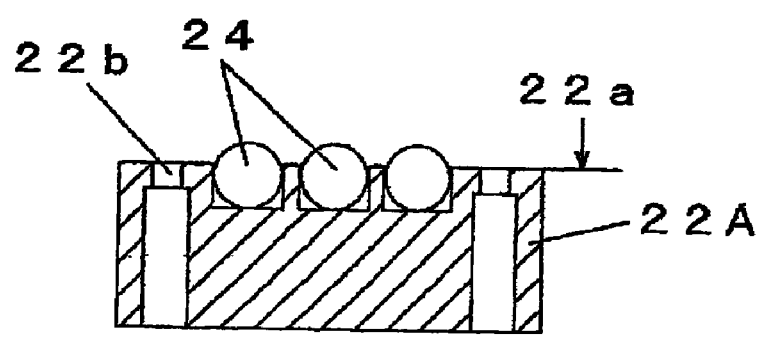

CHIP PICKUP APPARATUS, CHIP PICKUP METHOD, CHIP RELEASING DEVICE AND CHIP RELEASING METHOD

TECHNICAL FIELD

The present invention relates to a chip pickup apparatus, a chip pickup method, a chip releasing device and a chip releasing method each for picking up chips in a state of being cut out from a wafer and adhered on a sheet.

BACKGROUND ART

In a fabricating process of a semiconductor device, a semiconductor chip is cut out from a wafer configured by many pieces of chips. The respective pieces of chips are cut out in a state that the wafer is adhered on an adhesive sheet. The respective pieces of chips thus cut out are released from the sheet and picked up (see a patent document 1). This pickup process is performed in a manner that, while releasing the chip from the sheet by knocking up the chip by using an ejector from the lower surface side of the sheet in a state of sucking the sheet from the lower surface side thereof, the chip is adhered, held and picked up by a picking head.
A patent document 1: Japanese Patent No. 2679266

DISCLOSURE OF THE INVENTION

Problems that the Invention is to Solve

Chips tend to be thinned for the miniaturization of electronic parts in recent years, and so quite thin chips with a thickness of 100 μm or less having been put into practical use. However, such a thinned chip is quite difficult in handling since it has a low rigidity and is likely bent and broken quite easily. Thus, it is difficult to increase the speed and efficiency of the pickup operation. Further, there arises a case that chips are subjected to damages such as a breakage or a crick in the pickup process of picking up the respective pieces of chips from the wafer.

Accordingly, an object of the invention is to provide a chip pickup apparatus, a chip pickup method, a chip releasing device and a chip releasing method in each of which chips can be picked up at a high speed without being damaged.

Means for Solving the Problems

The chip pickup apparatus according to the invention is arranged in a manner that the chip pickup apparatus for picking up a chip of a plate shape adhered on a sheet, including:
a sheet holding portion which holds the sheet;
a picking nozzle which is moved up and down by a nozzle elevation mechanism relatively with respect to the sheet holding portion and abuts against an upper surface of the chip to thereby suck and hold the chip and to keep the chip in a flat state; and
a releasing promotion mechanism which is disposed below the sheet holding portion and abuts against a lower surface of the sheet to promote releasing of the chip from the sheet, wherein
the releasing promotion mechanism includes:
an elevation portion which has an abutment supporting surface that abuts against the lower surface of the sheet to support the sheet from a lower side thereof and which moves up and down relatively with respect to the sheet holding portion;
suction holes which are provided outside of a chip lower support area for supporting a chip from a lower side thereof at the abutment supporting surface and suck and hold the sheet from the lower surface side thereof; and
a push-up portion having a flexible push-up surface which is provided within the chip lower support area at the abutment supporting surface and abuts against the lower surface of the sheet to push the sheet up, and wherein
the push-up portion is abutted against the lower surface of the sheet so as to follow along the lower surface in a flat surface state in a moving down state of the picking nozzle, and in a chip picking operation where the picking nozzle sucking and holding the chip is moved up to pickup the chip, the push-up portion pushes the lower surface of the sheet up while the push-up surface is deformed in an upwardly protruded curved surface shape to thereby release between the chip and the sheet from an outer peripheral side of the chip.

The chip pickup method according to the invention is arranged in a manner that the chip pickup method for picking up a chip from a sheet by using a chip pickup apparatus comprising a sheet holding portion which holds the sheet, a picking nozzle which is moved up and down by a nozzle elevation mechanism relatively with respect to the sheet holding portion and abuts against an upper surface of the chip to thereby suck and hold the chip and to keep the chip in a flat state, and a releasing promotion mechanism which is disposed below the sheet holding portion and abuts against a lower surface of the sheet to promote releasing of the chip from the sheet,
wherein the releasing promotion mechanism includes:
an elevation portion which has an abutment supporting surface that abuts against the lower surface of the sheet to support the sheet from a lower side thereof and which moves up and down relatively with respect to the sheet holding portion;
suction holes which are provided outside of a chip lower support area for supporting a chip from a lower side thereof at the abutment supporting surface and suck and hold the sheet from the lower surface side thereof; and
a push-up portion having a flexible push-up surface which is provided within the chip lower support area at the abutment supporting surface and abuts against the lower surface of the sheet to push the sheet up, the method including:
abutting the push-up portion against the lower surface of the sheet so as to follow along the lower surface in a flat surface state in a moving down state of the picking nozzle;
pushing the lower surface of the sheet up by the push-up portion while the push-up surface is deformed in an upwardly protruded curved surface shape to thereby release between the chip and the sheet from an outer peripheral side of the chip in a chip picking operation where the picking nozzle sucking and holding the chip is moved up to pick up the chip; and
picking up the chip released from the sheet by the picking nozzle.

The chip releasing device according to the invention is arranged in a manner that the chip releasing device in a chip pickup apparatus for picking up a chip of a plate shape adhered on a sheet, wherein in a case of picking up the chip by a picking nozzle from the sheet which is held to a sheet holding portion, the chip releasing device is abutted against a lower surface of the sheet to promote releasing between the sheet and the chip, the chip releasing device including:
an elevation portion which has an abutment supporting surface that abuts against the lower surface of the sheet to support the sheet from a lower side thereof and which moves up and down relatively with respect to the sheet holding portion;

suction holes which are provided outside of a chip lower support area for supporting a chip from a lower side thereof at the abutment supporting surface and suck and hold the sheet from the lower surface side thereof; and a push-up portion having a flexible push-up surface which is provided within the chip lower support area at the abutment supporting surface and abuts against the lower surface of the sheet to push the sheet up, wherein the push-up portion is abutted against the lower surface of the sheet so as to follow along the lower surface in a flat surface state in a moving down state of the picking nozzle, and in a chip picking operation where the picking nozzle sucking and holding the chip is moved up to pick up the chip, the push-up portion pushes the lower surface of the sheet up while the push-up surface is deformed in an upwardly protruded curved surface shape to thereby release between the chip and the sheet from an outer peripheral side of the chip.

The chip releasing method according to the invention is arranged in a manner that the chip releasing method in a chip pickup apparatus for picking up a chip of a plate shape adhered on a sheet, wherein in a case of picking up the chip by a picking nozzle from the sheet which is held to a sheet holding portion, the chip releasing device is abutted against a lower surface of the sheet to promote releasing between the sheet and the chip, the releasing promotion mechanism includes;

an elevation portion which has an abutment supporting surface that abuts against the lower surface of the sheet to support the sheet from a lower side thereof and which moves up and down relatively with respect to the sheet holding portion;

suction holes which are provided outside of a chip lower support area for supporting a chip from a lower side thereof at the abutment supporting surface and suck and hold the sheet from the lower surface side thereof; and a push-up portion having a flexible push-up surface which is provided within the chip lower support area at the abutment supporting surface and abuts against the lower surface of the sheet to push the sheet up, the method including:

abutting the push-up portion against the lower surface of the sheet so as to follow along the lower surface in a flat surface state in a moving down state of the picking nozzle; and pushing the lower surface of the sheet up by the push-up portion while the push-up surface is deformed in an upwardly protruded curved surface shape to thereby release between the chip and the sheet from an outer peripheral side of the chip in a chip picking operation where the picking nozzle sucking and holding the chip is moved up to pick up the chip.

EFFECTS OF THE INVENTION

According to the invention, the push-up surface having flexibility is followed along the lower surface in the flat surface state in the moving down state of the picking nozzle and abutted against the lower surface, and in the chip picking operation where the picking nozzle is moved up together with the chip, the push-up portion pushes the lower surface of the sheet up while the push-up surface is deformed in the upwardly protruded curved surface shape to thereby release the chip from the sheet from the pouter peripheral side of the chip. Thus, the chip can be picked up at a high speed without being damaged.

BRIEF DESCRIPTION OF THE DRAWINGS

FIG. 8 is an explanatory figure for explaining the structure of the releasing promotion mechanism of the pickup apparatus for chips according to the first embodiment of the invention.

BEST MODE FOR CARRYING OUT THE INVENTION

First Embodiment

Figure 1:
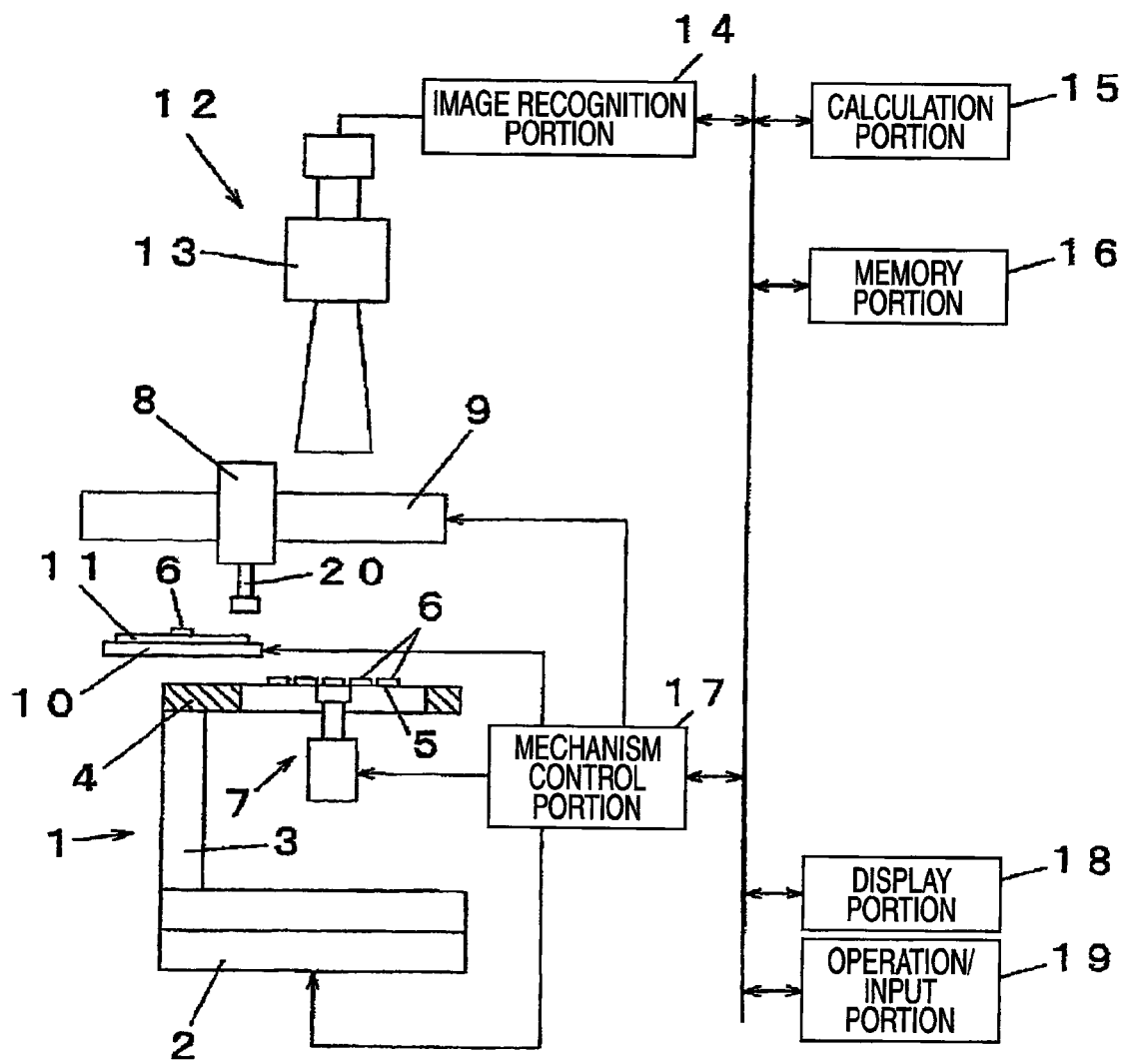
FIG. 1 is a block diagram showing the configuration of a pickup apparatus for chips according to the first embodiment of the invention.
Figure 2:
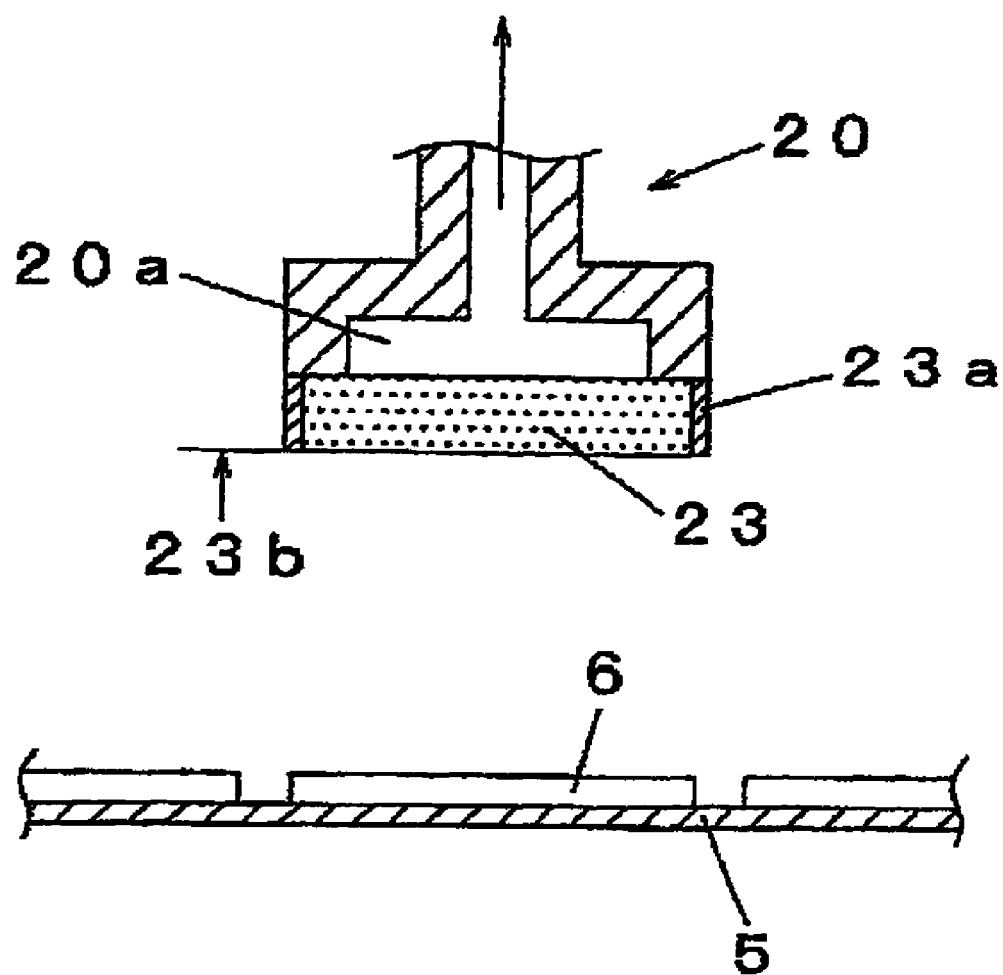
FIG. 2 is a sectional view showing a part of the picking nozzle of the pickup apparatus for chips according to the first embodiment of the invention.
Figure 3:
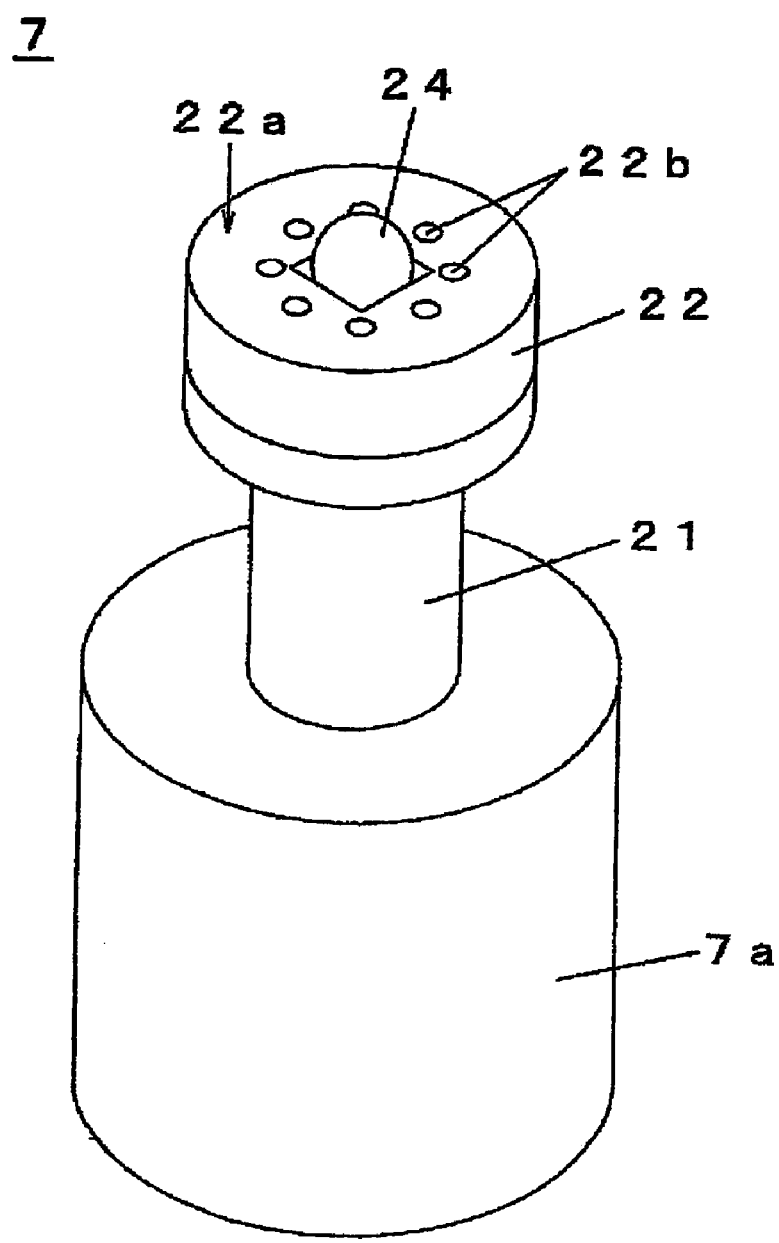
FIG. 3 is a perspective view showing the releasing promotion mechanism of the pickup apparatus for chips according to the first embodiment of the invention.
Figure 4:
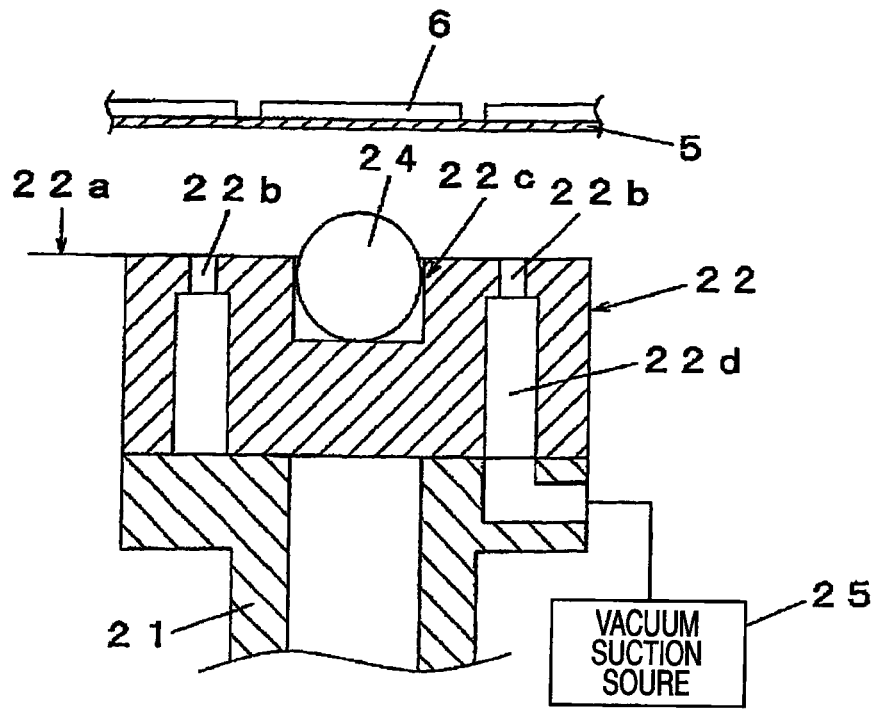
FIG. 4 is a sectional view showing a part of the releasing promotion mechanism of the pickup apparatus for chips according to the first embodiment of the invention.
Figure 5:
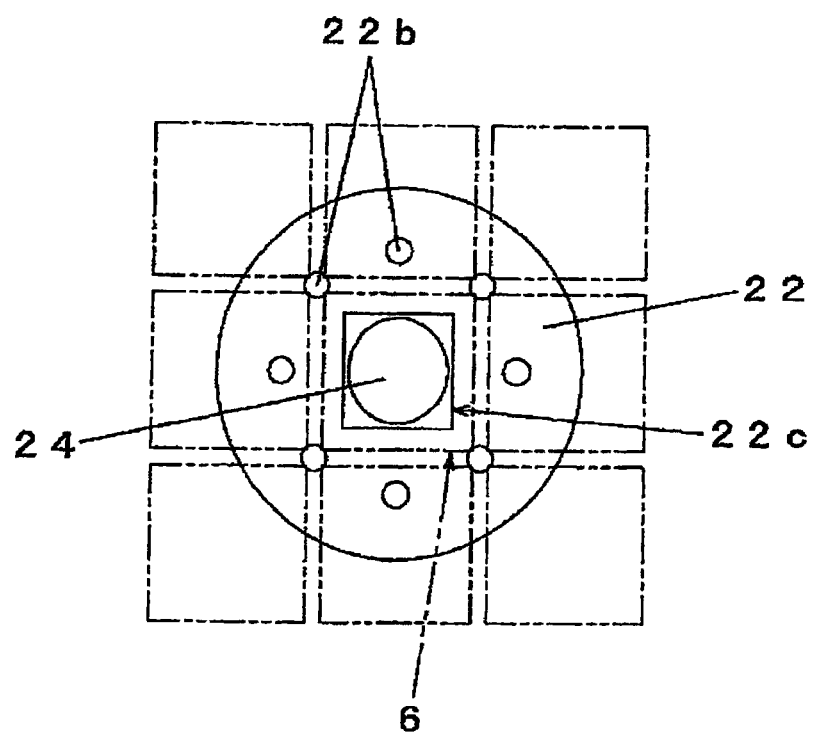
FIG. 5 is a plan view showing the releasing promotion mechanism of the pickup apparatus for chips according to the first embodiment of the invention.

FIG. 1 is a block diagram showing the configuration of a pickup apparatus for chips according to the first embodiment of the invention. FIG. 2 is a sectional view showing a part of the picking nozzle of the pickup apparatus for chips according to the first embodiment of the invention. FIG. 3 is a perspective view showing the releasing promotion mechanism of the pickup apparatus for chips according to the first embodiment of the invention. FIG. 4 is a sectional view showing a part of the releasing promotion mechanism of the pickup apparatus for chips according to the first embodiment of the invention. FIG. 5 is a plan view showing the releasing promotion mechanism of the pickup apparatus for chips according to the first embodiment of the invention. FIGS. 6A to 6C and FIGS. 7A to 7C are diagrams for explaining the process for picking a chip up according to the first embodiment of the invention. FIG. 8 is a diagram for explaining the structure of the releasing promotion mechanism of the pickup apparatus for chips according to the first embodiment of the invention.

First, the configuration of the pickup apparatus for chips will be explained with reference to FIG. 1. The pickup apparatus for chips has a function that a picking nozzle having an opening portion for vacuum sucking sucks, holds and picks up semiconductor chips in a state of being divided into respective pieces by the dicing process and adhered on a sheet. In FIG. 1, a chip supply portion 1 is configured by coupling a holding table 4 on a bracket 3 which is erected on an XY table 2. On the XY table 2, a sheet 5 is held on which a plurality of semiconductor chips 6 (hereinafter merely referred to "chip 6") are adhered. The holding table 4 acts as a sheet holding portion for holding the sheet 5. The chip 6 is a thin chip having been subjected to the thinning process and so has a property of a small rigidity and being likely bent.

A releasing promotion mechanism 7 (chip releasing device) is disposed beneath the holding table 4. The releasing promotion mechanism 7 has a function of abutting against the lower surface of the sheet 5 to promote the releasing of the chip 6 from the sheet 5 in the pickup operation of the chip 6 by a pickup head 8 explained below. The chip 6 to be picked up is positioned with respect to the releasing promotion mechanism 7 by driving the XY table 2. The pickup head 8 attached to a movable table 9 is disposed above the chip supply portion 1 so as to be movable in the horizontal direction. A picking nozzle 20 is attached to the lower portion of the pickup head 8. The picking nozzle 20 is movable in the elevational direction by a nozzle elevation mechanism contained in the pickup head 8.

As shown in FIG. 2, the picking nozzle 20 is provided with an opening portion 20a for vacuum sucking. A suction plate 23 is attached to the lower surface of the opening portion 20a. The suction plate 23 is formed by porous material such as sintered material and is configured in a manner that a vacuum suction source (not shown) is driven to vacuum-suck from the opening portion 20a to thereby uniformly suck and hold the entire area of the chip 6 by the holding surface 23b on the lower surface of the suction plate 23. A sealing film 23a having airtightness such as a resin film is provided at the outer peripheral surface of the suction plate 23 so as to secure the suction property at the time of the vacuum suction.

The surface 23a is processed to have a flat surface. Thus, even in the case where the thin and flexible chip 6 is held, since the chip 6 is also in its entire region closely adhered to and held by the holding surface 23b by the vacuum chucking, the chip 6 can be held in a flat state. That is, the picking nozzle 20 is moved up and down relatively with respect to the holding table 4 by the nozzle elevation mechanism, and the suction plate 23 is provided at the lower surface thereof with the holding surface 23b which abuts against the upper surface of the chip 6 to chuck and hold the chip 6 and also holds the chip in the flat state.

The chip 6 released from the sheet 5 is picked up by the vacuum sucking of the picking nozzle 20. The chip 6 thus picked up is moved above a substrate holding table 10 together with the picking nozzle 20 when the pickup head 8 is moved by the movable table 9. Then, by moving the picking nozzle 20 up and down, the chip 7 is mounted on a substrate 11 held by the substrate holding table 10.

An image pickup portion 12 having a camera 13 is disposed above the holding table 4. The image pickup portion 12 picks up an image of the chip 6 on the sheet 5 from the upper direction thereof and outputs an image picked-up result to an image recognition portion 14. The image recognition portion 14 subjects the image picked-up result to are cognition processing to detect the position of the chip 6. A calculation portion 15 is a CPU which executes programs stored in a memory portion 16 to perform various kinds of operation processings and calculations to thereby control respective portions explained below. The memory portion 16 stores programs necessary for operating the respective portions of the apparatus and various kinds of data such as the size of the chip to be recognized and arrangement data on the sheet 5 etc.

A mechanism control portion 17 controls the pickup head 8, the movable table 9 for moving the pickup head 8, the releasing promotion mechanism 7 and the XY table 2. The XY table 2, the holding table 4, the movable table 9, the calculation portion 15 and the mechanism control portion 17 constitute a positioning means which relatively positions the chip to be picked up with respect to the opening portion 20a of the picking nozzle 20 based on the position detection result of the chip 6 by a position detection means. A display portion 18 displays a picked-up image of the chip 6 and a screen at the time of an operation and an input. An operation/input portion 19 is an input device such as a key board and performs an operation input and a data input.

Next, the configuration of the releasing promotion mechanism 7 will be explained with reference to FIGS. 3 and 4. As shown in FIG. 3, the releasing promotion mechanism 7 is configured by a mechanism main body portion 7a, and a supporting shaft portion 21 and a releasing tool 22 each supported by the mechanism main body portion 7a so as to be movable in the elevational direction. The releasing tool 22 is prepared independently in accordance with the shape and size of the chip 6 and attached on the surface of the supporting shaft portion 21 so as to be exchanged.

A tool elevation mechanism (not shown) is contained within the mechanism main body portion 7a. When the tool elevation mechanism is driven, the releasing tool 22 moves up and down relatively to the sheet 5 held on the holding table 4. The upper surface of the releasing tool 22 serves as an abutment supporting surface 22a which abuts against the lower surface of the sheet 5 and supports the sheet 5 from the lower side in the sheet releasing operation. Thus, the releasing tool 22 is provided with the abutment supporting surface which abuts against the lower surface of the sheet 5 and supports the sheet 5 from the lower side and serves as an elevational portion which relatively moves up and down with respect to the holding table 4.

The abutment supporting surface 22a is provided with a plurality of suction holes 22b which are disposed concentrically. A sheet push-up member 24, which is formed by flexible elastic material such as rubber so as to have an upwardly protruded curved surface shape (a spherical shape in this embodiment) is attached to an attachment concave portion 22c of a square shape which is provided at a position surrounded by the suction holes 22b. As shown in FIGS. 4 and 5, the suction holes 22b are disposed so as to be positioned at an area corresponding to the chip 6, that is, at the outside of the area for supporting the chip from the lower side thereof in a state that the abutment supporting surface 22a abuts against the lower surface of the sheet 5 and positioned to the chip 6 to be picked up.

Each of these suction holes 22b is provided so as to penetrate from a suction space 22d of a circumferential groove shape provided at the inner portion of the releasing tool 22 to the abutment supporting surface 22a. Further, the suction space 22d communicates with a vacuum suction source 25 via the inner portion of the supporting shaft portion 21. When the vacuum suction source 25 is driven in a state that the abutment supporting surface 22a is abutted against the lower surface of the sheet 5, the air is sucked from the suction holes 22b and so the sheet 5 is sucked and held to the abutment supporting surface 22a.

The sheet push-up member 24 is disposed so as to be located at the center within the area for supporting the chip from the lower side at the abutment supporting surface 22a. As explained below, the sheet push-up member 24 acts as a push-up portion having a flexible push-up surface which abuts against the lower surface of the sheet 5 and pushes the sheet 5 up in the chip picking operation for picking up the chip 6 by using the picking nozzle 20.

In other words, when the releasing tool 22 is relatively moved upward with respect to the sheet 5 in a state that the chip 6 is held in a flat surface state by the picking nozzle 20, the upper surface side of the sheet push-up member 24, that is, a portion of the sheet push-up member protruding upward from the abutment supporting surface 22a is pushed by the sheet 5 and deformed. Further, in a state that the releasing tool 22 is further pressed against the sheet 5 to thereby deform the sheet push-up member 24 until the abutment supporting surface 22a abuts against lower surface of the sheet 5, the sheet push-up member 24 abuts against the lower surface of the sheet 5 in a state that the upper surface of the sheet push-up member follows the lower surface of the sheet in a flat surface manner and the upper portion of the sheet push-up member becomes flat.

Next, when the picking nozzle 20 holding the chip 6 is moved upward after the sheet 5 is sucked and held by the suction holes 22b, the chip 6 is released from the sheet 5 as explained below. When the chip 6 moves upward together with the picking nozzle 20, a force for releasing the chip 6 acts on the sheet 5 which is sucked and held by the abutment supporting surface 22a. In this case, since the sheet push-up member 24 in the compressed and deformed state abuts against the lower surface of the sheet 5, the sheet push-up member 24 deforms so as to be restored to the original shape (the upwardly protruded curved surface shape (the spherical shape in this embodiment)) in accordance with the upward movement of the picking nozzle 20, whereby the sheet 5 is pushed up by the upper surface of the sheet push-up member 24. That is, the upper surface of the sheet push-up member 24 serves as a push-up surface for pushing the sheet 5 up.

In this case, since the push-up surface is configured in the protruded curved surface shape, the upper surface of the sheet push-up member 24 does not act as the push-up surface at the portion near the outer peripheral portion of the chip 6. Thus, the releasing between the chip 6 and the sheet 5 proceeds in accordance with the upward movement of the chip 6 at the portion near the outer peripheral portion of the chip 6. In contrast, at the center portion of the chip 6, the push-up surface of the sheet push-up member 24 pushes the sheet 5 up in accordance with the upward moving of the chip 6 to thereby keep the adhering state between the sheet 5 and the chip 6. When the chip 6 moves up to the position higher than the height of the protruded portion of the sheet push-up member 24, the sheet push-up member 24 does not act to push the sheet 5 up any longer, whereby the sheet 5 is completely released from the chip 6. In the releasing promotion operation by the sheet push-up member 24, the releasing between the sheet 5 and the chip 6 progresses from the outer peripheral side of the ship 6.

That is, in the aforesaid configuration, in a state that the picking nozzle 20 is relatively moved down with respect to the releasing tool 22, the push-up surface of the sheet push-up member 24 is followed in the flat surface manner on the lower surface of the sheet 5 and abutted against the lower surface. In the chip picking operation for moving up the picking nozzle 20 sucking and holding the chip 6 to thereby pick up the chip, the sheet push-up member 24 pushes up the lower surface of the sheet 5 while deforming the push-up surface thereof in the upwardly protruded curved surface shape to thereby release the sheet 5 from the chip 6 at the outer peripheral side of the chip.

Figure 6A:
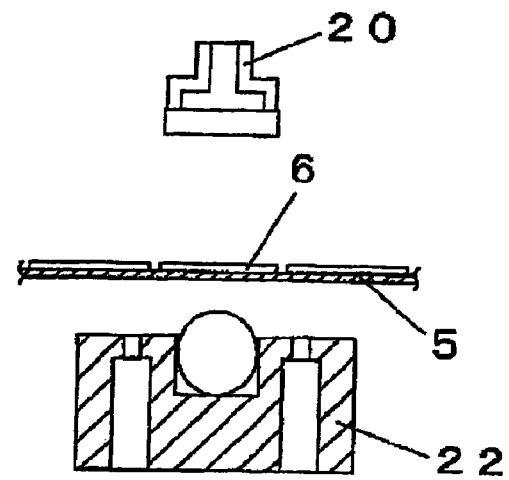
FIG. 6A is an explanatory figure for explaining the process for picking a chip up according to the first embodiment of the invention.
Figure 6B:
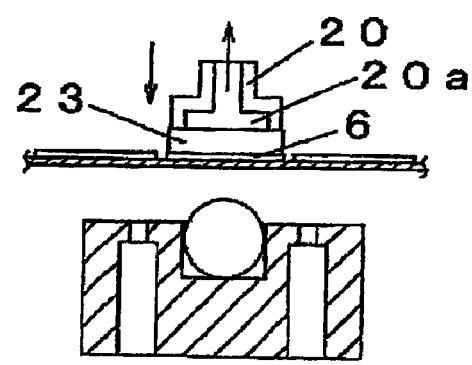
FIG. 6B is an explanatory figure for explaining the process for picking a chip up according to the first embodiment of the invention.

The chip pickup apparatus is configured in the aforesaid manner. Next, the pickup method using the chip pickup apparatus will be explained with reference to FIGS. 6A to 7C. In FIG. 6A, the chip 6 to be picked up in the pickup operation is located above the releasing tool 22 in a state of being adhered to the sheet 5. Then, as shown in FIG. 6B, the picking nozzle 20 is moved down to thereby abut the suction plate 23 against the upper surface of the chip 6. Further, the air is sucked from the opening portion 20a to hold the chip 6 by the suction plate 23. Thus, the chip 6 is held in the flat surface state by the holding surface 23b at the lower surface of the suction plate 23.

Figure 6C:
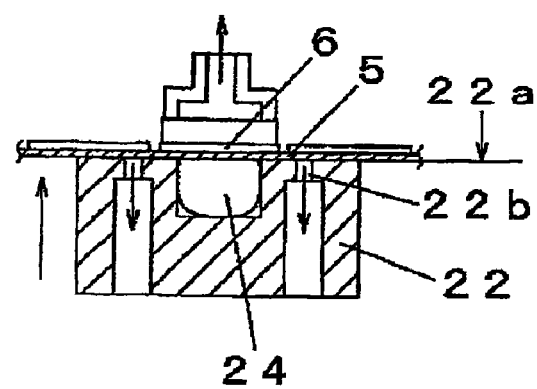
FIG. 6C is an explanatory figure for explaining the process for picking a chip up according to the first embodiment of the invention.

Next, as shown in FIG. 6C, the releasing tool 22 is moved up to thereby abut the abutment supporting surface 22a against the lower surface of the sheet 5. Further, the air is sucked from the suction holes 22b to thereby suck and hold the sheet 5 to the abutment supporting surface 22a. In this case, since the sheet 5 is pushed against the sheet push-up member 24 while the chip 6 is kept in the flat surface state, the sheet push-up member 24 is deformed from the spherical shape to the flat surface state in a manner that the upper surface of the sheet push-up member follows the lower surface of the sheet 5.

Figure 7A:
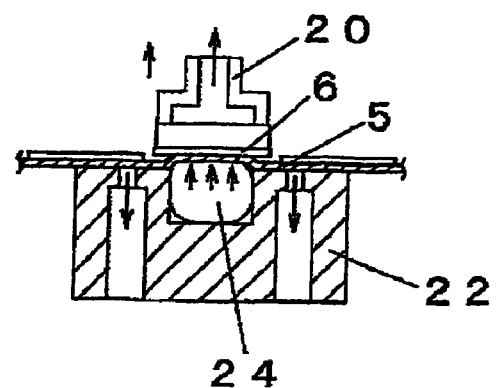
FIG. 7A is an explanatory figure for explaining the process for picking a chip up according to the first embodiment of the invention.

Thereafter, the chip picking operation is started in which the picking nozzle 20 is moved up to thereby release the chip 6 from the sheet 5 and pick up the chip. That is, as shown in FIG. 7A, in a state where the picking nozzle 20 is moved up slightly, the sheet push-up member 24 having the push-up surface of the upwardly protruded curved surface shape starts to restore to the original spherical shape. Thus, the sheet 5 is pushed up by the sheet push-up member 24 to maintain the adhered state to the chip 6 in an almost entire area thereof except for the outer peripheral side of the chip 6, so that the releasing between the chip 6 and the sheet 5 starts only at the outer peripheral side.

Figure 7B:
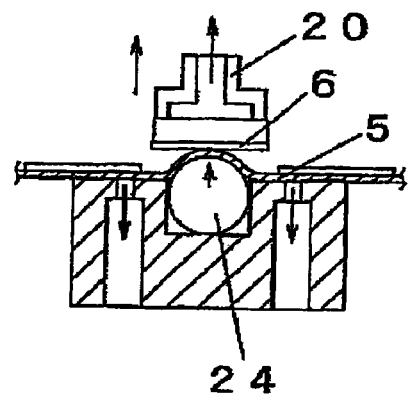
FIG. 7B is an explanatory figure for explaining the process for picking a chip up according to the first embodiment of the invention.
Figure 7C:
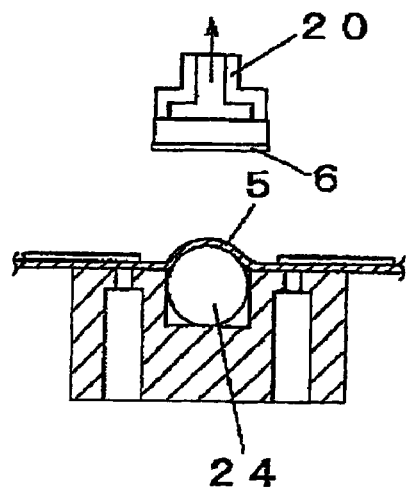
FIG. 7C is an explanatory figure for explaining the process for picking a chip up according to the first embodiment of the invention.

Thereafter, when the picking nozzle 20 is further moved up, the releasing between the sheet 5 and the chip 6 proceeds from the outer peripheral side of the chip 6 in accordance with the upward movement of the chip 6. Then, as shown in FIG. 7B, the sheet 5 is placed in a state that the sheet is adhered to the lower surface of the chip 6 only at the portion pushed up by the tip portion of the push-up surface of the sheet push-up member 24. Thereafter, as shown in FIG. 7C, when the picking nozzle 20 is further moved up, the chip 6 thus held is completely released and separated from the sheet 5 to thereby complete the picking operation of the chip 6.

That is, in the aforesaid chip pickup method, in the downward moving state of the picking nozzle 20, the push-up surface of the sheet push-up member 24 is followed in the flat surface state on the lower surface of the sheet 5 and abutted against the lower surface. Then, in the chip picking operation where the picking nozzle 20 sucking and holding the chip 6 is moved up to thereby pick up the chip 6, the sheet push-up member 24 pushes up the lower surface of the sheet 5 while deforming the push-up surface of the sheet push-up member 24 in the upwardly protruded curved surface shape to thereby release the chip 6 from the sheet 5 from the outer periphery side of the chip. Then, the chip 6 thus released from the sheet 5 is picked up by the picking nozzle 20. Thus, even in the case of handling chips of a thin type or chips which are fabricated by fragile material, have a low rigidity and are easily broken, the pickup operation can be performed at a high speed without damaging the chips.

Although the aforesaid embodiment shows an example where the chip 6 of the almost square shape is subjected to the processing, when a chip subjected to the processing has a flat surface shape elongated in one direction such as a rectangle, a releasing tool 22A having a configuration as shown in FIG. 8 can be used. In FIG. 8, on the abutment supporting surface 22a of the upper surface of the releasing tool 22A, the three attachment concave portions 22c are provided at the inside of the chip lower support area for a chip 6A having a rectangular flat surface shape. The sheet push-up member 24 shown in FIG. 4 is attached to each of the attachment concave portions 22c.

That is, in this embodiment, a plurality of the sheet push-up members 24 each serving as the push-up portion are disposed in the long side direction of a chip 6A. In this embodiment, also in the case of picking up the chip 6A by the picking nozzle 20, the sheet 5 is pushed up by the sheet push-up member 24 in an area thereof except for the outer peripheral side of the chip 6A. Thus, since the releasing between the chip 6A and the sheet 5 starts surely from the outer peripheral side of the chip 6A, effects similar to those of the aforesaid embodiment can also be obtained in this embodiment.

Regardless of the shape of a chip, a plurality of the sheet push-up members 24 may be disposed in the side directions of the chip. For example, in the case of the chip 6 of a square shape, the five sheet push-up members 24 may be disposed at five portions in total, that is, portions near the four corner portions and a portion near the center of the chip in the plan view of the chip 6. The number of the plurality of the sheet push-up members 24 may be set arbitrarily and the sizes of the respective sheet push-up members 24 may be differentiated to each other.

Second Embodiment

Figure 9:
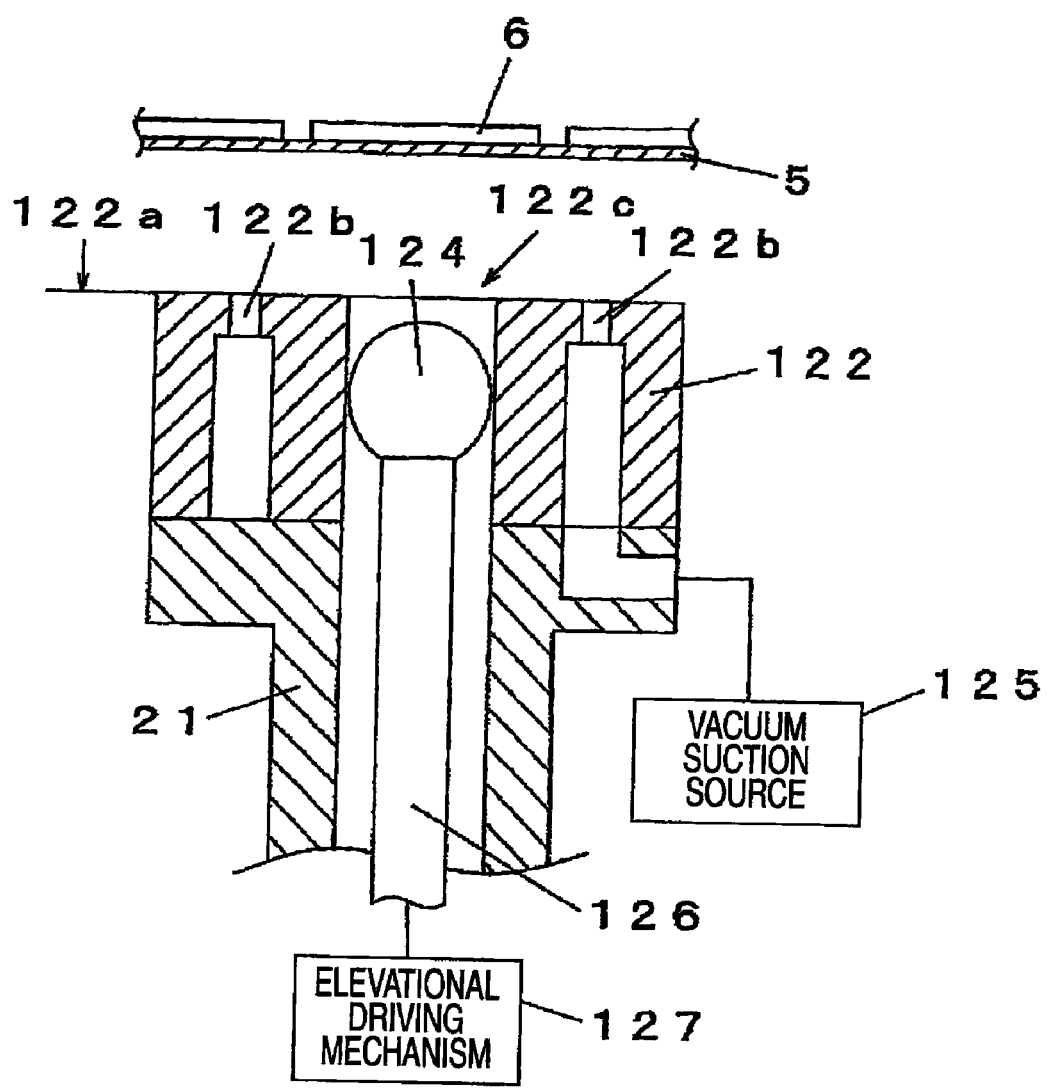
FIG. 9 is a sectional view showing a part of the picking nozzle of the pickup apparatus for chips according to the second embodiment of the invention.
Figure 10A:
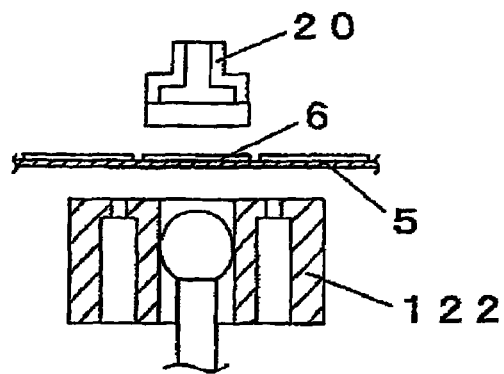
FIG. 10A is an explanatory figure for explaining the process for picking a chip up according to the second embodiment of the invention.
Figure 10B:
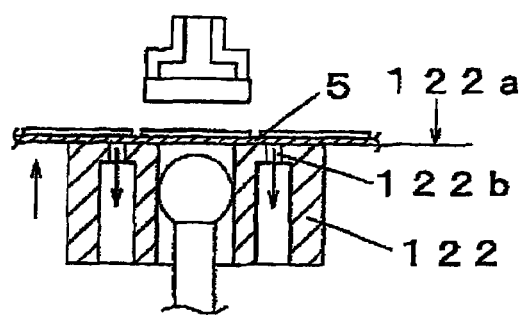
FIG. 10B is an explanatory figure for explaining the process for picking a chip up according to the second embodiment of the invention.
Figure 11A:
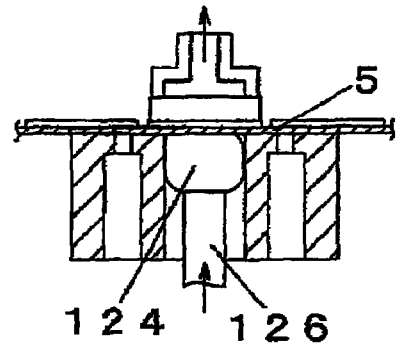
FIG. 11A is an explanatory figure for explaining the process for picking a chip up according to the second embodiment of the invention.
Figure 11B:
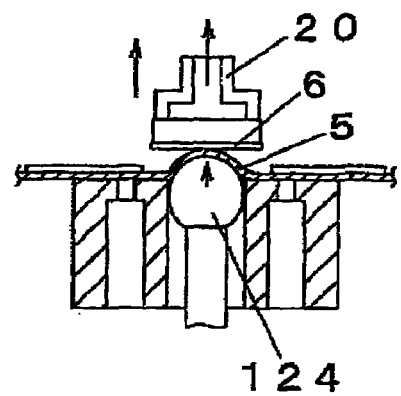
FIG. 11B is an explanatory figure for explaining the process for picking a chip up according to the second embodiment of the invention.
Figure 11C:
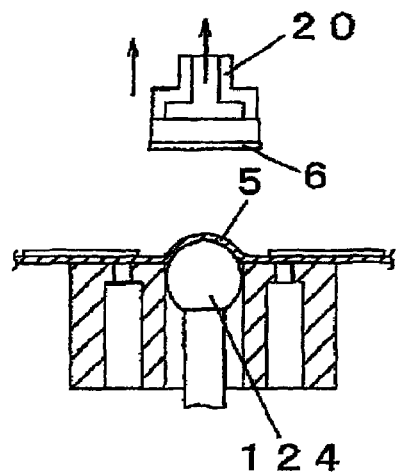
FIG. 11C is an explanatory figure for explaining the process for picking a chip up according to the second embodiment of the invention.
Figure 12:
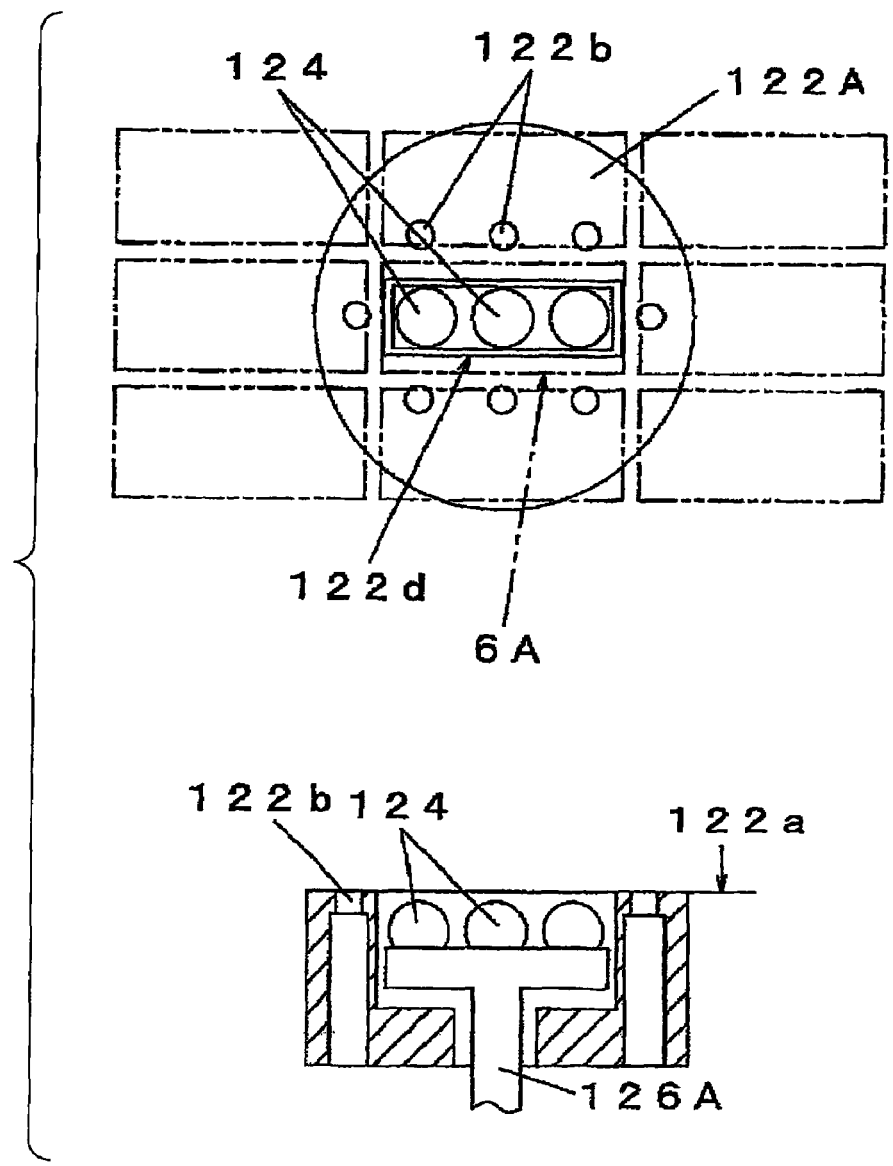
FIG. 12 is a diagram for explaining the structure of the releasing promotion mechanism of the pickup apparatus for chips according to the second embodiment of the invention.

FIG. 9 is a sectional view showing a part of the picking nozzle of the pickup apparatus for chips according to the second embodiment of the invention. FIGS. 10A to 10C and FIGS. 11A to 11C are explanatory figures for explaining the process for picking chips up according to the second embodiment of the invention. FIG. 12 is an explanatory figure for explaining the structure of the releasing promotion mechanism of the pickup apparatus for chips according to the second embodiment of the invention.

In FIG. 9, a releasing tool 122 is configured so as to be able to move up and down the sheet push-up member 24 which is fixedly attached at the center of the abutment supporting surface 22a in the releasing tool 22 shown in FIG. 4, and is attached to the supporting shaft portion 21 so as to be exchangeable like the releasing tool of the aforesaid embodiment. A plurality of suction holes 122b are provided concentrically at the abutment supporting surface 122a. Like the first embodiment, when a vacuum suction source 125 is driven, the air is sucked from the suction holes 122b, whereby the sheet 5 can be sucked and held to the abutment supporting surface 122a.

An attachment hole portion 122c is provided at the inner side of the suction holes 122b so at to penetrate in the vertical direction. A sheet push-up shaft 126 is inserted within the attachment hole portion 122c so as to pass therethrough in the vertical direction. A sheet push-up member 124 having the similar configuration as that of the sheet push-up member 24 shown in the first embodiment is fixedly attached to the upper end portion of the sheet push-up shaft 126. The sheet push-up shaft 126 is movable upwardly and downwardly by an elevational driving mechanism 127. In a normal state, the sheet push-up member 124 locates below the abutment supporting surface 122a. The sheet push-up member 124 acts as a push-up portion like the sheet push-up member 24 in the first embodiment by protruding the upper portion of the sheet push-up member 124 from the abutment supporting surface 122a by the elevational driving mechanism 127.

Specifically, in the aforesaid configuration, the sheet push-up member 124 is provided so as to be movable upwardly and downwardly with respect to the releasing tool 122 and is arranged in a manner that when the sheet push-up member 124 is moved up after the picking nozzle 20 is moved down to thereby suck and hold the chip 6 in advance, the push-up surface is followed along the lower surface of the sheet 5 in a flat surface state and abutted against the lower surface.

Next, the pickup method using the chip pickup apparatus will be explained with reference to FIGS. 10A to 11C. In FIG. 10A, the chip 6 to be picked up in the pickup operation is located above the releasing tool 122 in a state of being adhered to the sheet 5. Next, as shown in FIG. 10B, the releasing tool 122 is moved up to thereby abut the abutment supporting surface 122a against the lower surface of the sheet 5 and further the air within the suction holes 122b is sucked to thereby suck and hold the sheet 5 to the abutment supporting surface 122a.

Figure 10C:
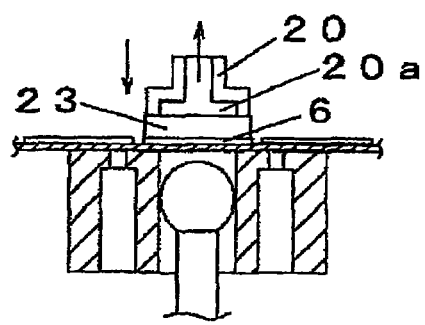
FIG. 10C is an explanatory figure for explaining the process for picking a chip up according to the second embodiment of the invention.

Then, as shown in FIG. 10C, the picking nozzle 20 is moved down to thereby abut the suction plate 23 against the upper surface of the chip 6 and further the air within the air is sucked from the opening portion 20a to thereby hold the chip 6 by the suction plate 23. Thus, the chip 6 is held in a flat surface state by the holding surface 23b of the suction plate 23. Next, as shown in FIG. 11A, the elevational driving mechanism 127 is driven to move the sheet push-up shaft 126 up to thereby push the sheet push-up member 124 against the lower surface of the sheet 5 while keeping the chip 6 in the flat state. As a result, the sheet push-up member 124 deforms from a spherical shape and is placed in a flat state where the upper surface thereof follows along the lower surface of the sheet 5.

Thereafter, the picking nozzle 20 is moved up to thereby start the chip picking operation is started in which the chip 6 is released from the sheet 5 and picked up. In this case, like the state shown in FIG. 7A in the first embodiment, since the sheet push-up member 124 starts to restore to the original shape, the sheet 5 starts to release from the outer peripheral side of the chip 6. When the picking nozzle 20 is further moved up, the releasing between the sheet 5 and the chip 6 proceeds from the outer peripheral side of the chip 6. Then, as shown in FIG. 11B, the sheet 5 is placed in a state that the sheet is adhered to the lower surface of the chip 6 only at the portion pushed up by the tip portion of the push-up surface of the sheet push-up member 124. Thereafter, as shown in FIG. 11C, when the picking nozzle 20 is further moved up, the chip 6 thus held is completely released and separated from the sheet 5 to thereby complete the picking operation of the chip 6. The second embodiment can also attain effects similar to those of the first embodiment.

Although the aforesaid embodiment shows an example where the chip 6 of the almost square shape is subjected to the processing, when a chip subjected to the processing has a flat surface shape elongated in one direction such as a rectangle, an abutment supporting surface 122a having a configuration as shown in FIG. 12 can be used. In FIG. 12, on the abutment supporting surface 122a of the upper surface of the releasing tool 122, a portions 122d is provided at the inside of the chip lower support area for a chip 6A having a rectangular flat surface shape. A sheet push-up shaft 126A, attached at its upper end portion with the three sheet push-up members 124, is fit into the fitting opening portion 122d in a manner that the sheet push-up shaft 126A is movable upwardly and downwardly by the elevational driving mechanism 127 shown in FIG. 9.

In the aforesaid configuration, each of these three sheet push-up members 124 has a function similar to that of the sheet push-up member 124 in the chip picking operation shown in FIGS. 11A to 11C, whereby the sheet 5 is pushed up by the three sheet push-up members 124 in the picking operation of the chip 6A. That is, in this embodiment, a plurality of the push-up portions are disposed along the long side direction of the chip 6A. In this embodiment, also in the case of picking up the chip 6A by the picking nozzle 20, since the releasing between the chip 6A and the sheet 5 starts surely from the outer peripheral side of the chip 6A, effects similar to those of the aforesaid embodiment can also be obtained in this embodiment.

Regardless of the shape of a chip, a plurality of the sheet push-up members 124 may be disposed in the side directions of the chip. For example, in the case of the chip 6 of a square shape, the five sheet push-up members 124 may be disposed at five portions in total, that is, portions near the four corner portions and a portion near the center of the chip in the plan view of the chip 6. The number of the plurality of the sheet push-up members 124 may be set arbitrarily and the sizes of the respective sheet push-u members 124 may be differentiated to each other.

Further, although each of the first and second embodiments shows an example where a sphere fabricated by elastic material such as rubber is used as each of the sheet push-up members 24, 124, the shape and configuration of each of the sheet push-up members 24, 124 are not limited thereto and various kinds of variations may be employed. For example, the shape of the push-up surface is not limited to a spherical shape and various kinds of shapes such as a parabolic curved surface or an elliptical curved surface may be employed so long as it is a curved surface protruded upward. Further, the configuration of the sheet push-up member 24 is not limited to a solid body having no space portion therein but may be a hollow body having a cavity therein.

Further, although the aforesaid embodiments are arranged in a manner that a restoring force generated when flexible elastic material such as rubber restores to an original shape is used as a push-up force at the time of pushing up the sheet 5 by the sheet push-up members 24, 124, the sheet push-up member 24 may be configured by a hollow body which is arranged to expand when the air is injected therein. This configuration is advantageous in that the magnitude of the push-up force and the push-up timing can be controlled arbitrarily.

INDUSTRIAL APPLICABILITY

The pickup apparatus and the pickup method for chips according to the invention have effects that a chip can be released from the sheet from the end surface side thereof and then picked up at a high speed without damaging the chip, and are useful for the pickup apparatus for picking up thin chips.

The invention claimed is:

1. A chip pickup apparatus for picking up a chip of a plate shape adhered on a sheet, comprising:
a sheet holding portion which holds the sheet;
a picking nozzle which is moved up and down by a nozzle elevation mechanism relatively with respect to the sheet holding portion and abuts against an upper surface of the chip to thereby suck and hold the chip and to keep the chip in a flat state; and
a releasing promotion mechanism which is disposed below the sheet holding portion and abuts against a lower surface of the sheet to promote releasing of the chip from the sheet,
wherein the releasing promotion mechanism includes:
an elevation portion which has an abutment supporting surface that abuts against the lower surface of the sheet to support the sheet from a lower side thereof and which moves up and down relatively with respect to the sheet holding portion;
suction holes which are provided outside of a chip lower support area for supporting the chip from a lower side thereof at the abutment supporting surface and suck and hold the sheet from the lower surface side thereof; and
a push-up portion having a flexible push-up surface which is provided within the chip lower support area at the abutment supporting surface and abuts against the lower surface of the sheet to push the sheet up, and
wherein the push-up portion has an original upwardly protruded curved surface shape, the push-up portion is abutted against the lower surface of the sheet so that the push-up surface follows along the lower surface in a flat surface state, deformed from the original upwardly protruded curved surface shape, in a moved down state of the picking nozzle, and in a chip picking operation where, as the picking nozzle sucking and holding the chip is moved up to pick up the chip, the push-up surface returns to the original upwardly protruded curved surface shape and pushes the lower surface of the sheet up to thereby release an outer peripheral side of the chip from the sheet, and
wherein the push-up portion is spherical.

2. A chip pickup apparatus according to claim 1, wherein the push-up portion is configured by forming a flexible elastic material in a shape having an upwardly protruded curved surface.

3. A chip pickup apparatus according to claim 1, wherein a plurality of the push-up devices are disposed.

4. A chip pickup apparatus according to claim 1, wherein the push-up portion is provided so as to be movable upwardly and downwardly with respect to the elevation portion, and
wherein, after the picking nozzle is moved down to suck and hold the chip in advance, the push-up portion is moved up so that the push-up surface follows along the lower surface of the sheet in the flat surface state and abuts against the lower surface.

5. A chip releasing device in a chip pickup apparatus for picking up a chip of a plate shape adhered on a sheet, wherein in a case of picking up the chip by a picking nozzle from the sheet which is held to a sheet holding portion, the chip releasing device is abutted against a lower surface of the sheet to promote releasing between the sheet and the chip, the chip releasing device comprising:
an elevation portion which has an abutment supporting surface that abuts against the lower surface of the sheet to support the sheet from a lower side thereof and which moves up and down relatively with respect to the sheet holding portion;

suction holes which are provided outside of a chip lower support area for supporting a chip from a lower side thereof at the abutment supporting surface and suck and hold the sheet from the lower surface side thereof; and a push-up portion having a flexible push-up surface which is provided within the chip lower support area at the abutment supporting surface and abuts against the lower surface of the sheet to push the sheet up, wherein the push-up portion has an original upwardly protruded curved surface shape, the push-up portion is abutted against the lower surface of the sheet so that the push-up surface follows along the lower surface in a flat surface state, deformed from the original upwardly protruded curved surface shape, in a moved down state of the picking nozzle, and in a chip picking operation where, as the picking nozzle sucking and holding the chip is moved up to pick up the chip, the push-up surface returns to the original upwardly protruded curved surface shape and pushes the lower surface of the sheet up to thereby release an outer peripheral side of the chip from the sheet, and wherein the push-up portion is spherical.

6. A chip releasing device according to claim 5, wherein the push-up portion is configured by forming a flexible elastic material in a shape having an upwardly protruded curved surface.

7. A chip releasing device according to claim 5, wherein a plurality of the push-up devices are disposed.

8. A chip releasing device according to claim 5, wherein the push-up portion is provided so as to be movable upwardly and downwardly with respect to the elevation portion, and wherein, after the picking nozzle is moved down to suck and hold the chip in advance, the push-up portion is moved up so that the push-up surface follows along the lower surface of the sheet in the flat surface state and abuts against the lower surface.

9. A chip pickup method for picking up a chip from a sheet by using a chip pickup apparatus comprising a sheet holding portion which holds the sheet, a picking nozzle which is moved up and down by a nozzle elevation mechanism relatively with respect to the sheet holding portion and abuts against an upper surface of the chip to thereby suck and hold the chip and to keep the chip in a flat state, and a releasing promotion mechanism which is disposed below the sheet holding portion and abuts against a lower surface of the sheet to promote releasing of the chip from the sheet, wherein the releasing promotion mechanism includes:

an elevation portion which has an abutment supporting surface that abuts against the lower surface of the sheet to support the sheet from a lower side thereof and which moves up and down relatively with respect to the sheet holding portion;

suction holes which are provided outside of a chip lower support area for supporting a chip from a lower side thereof at the abutment supporting surface and suck and hold the sheet from the lower surface side thereof; and a push-up portion having a flexible push-up surface which is provided within the chip lower support area at the abutment supporting surface and abuts against the lower surface of the sheet to push the sheet up, the method comprising:

abutting the push-up portion against the lower surface of the sheet so that the push-up surface follows along the lower surface in a flat surface state, deformed from an original upwardly protruded curved surface shape, in a moved down state of the picking nozzle;

moving up the picking nozzle sucking and holding the chip in a chip picking operation to allow the push-up surface to return to the original upwardly protruded curved surface shape to thereby release an outer peripheral side of the chip from the sheet; and picking up the chip released from the sheet by the picking nozzle.

10. A chip pickup method according to claim 9, wherein the push-up portion is configured by forming a flexible elastic material in a shape having an upwardly protruded curved surface, and in the moved down state of the picking nozzle, the push-up portion is elastically deformed via the chip and the sheet by the picking nozzle so that the push-up surface follows in the flat surface state along the lower surface of the sheet and abuts against the lower surface.

11. A chip pickup method according to claim 9, wherein the push-up portion is provided so as to be movable upwardly and downwardly with respect to the elevation portion, and wherein, after the picking nozzle is moved down to suck and hold the chip in advance, the push-up portion is moved up so that the push-up surface follows along the lower surface of the sheet in the flat surface state and abuts against the lower surface.

12. A chip pickup method according to claim 9, wherein the push-up portion is spherical.

13. A chip releasing method in a chip pickup apparatus for picking up a chip of a plate shape adhered on a sheet, wherein in a case of picking up the chip by a picking nozzle from the sheet which is held to a sheet holding portion, the chip releasing device is abutted against a lower surface of the sheet to promote releasing between the sheet and the chip, the releasing promotion mechanism includes:

an elevation portion which has an abutment supporting surface that abuts against the lower surface of the sheet to support the sheet from a lower side thereof and which moves up and down relatively with respect to the sheet holding portion;

suction holes which are provided outside of a chip lower support area for supporting a chip from a lower side thereof at the abutment supporting surface and suck and hold the sheet from the lower surface side thereof; and a push-up portion having a flexible push-up surface which is provided within the chip lower support area at the abutment supporting surface and abuts against the lower surface of the sheet to push the sheet up, the method comprising:

abutting the push-up portion against the lower surface of the sheet so that the push-up surface follows along the lower surface in a flat surface state, deformed from an original upwardly protruded curved surface shape, in a moved down state of the picking nozzle; and moving up the picking nozzle sucking and holding the chip in a chip picking operation to allow the push-up surface to return to the original upwardly protruded curved surface shape to thereby release an outer peripheral side of the chip from the sheet.

14. A chip releasing method according to claim 13, wherein the push-up portion is configured by forming a flexible elastic material in a shape having an upwardly protruded curved surface, and in the moved down state of the picking nozzle, the push-up portion is elastically deformed via the chip and the sheet by the picking nozzle so that the push-up surface follows in the flat surface state along the lower surface of the sheet and abuts against the lower surface.

15. A chip releasing method according to claim 13, wherein the push-up portion is provided so as to be movable upwardly and downwardly with respect to the elevation portion, and wherein, after the picking nozzle is moved down to suck and hold the chip in advance, the push-up portion is moved up so that the push-up surface follows along the lower surface of the sheet in the flat surface state and abuts against the lower surface.

16. A chip releasing method according to claim 13, wherein the push-up portion is spherical.

* * * * *